(12) United States Patent
Tayebati

(10) Patent No.: US 6,597,490 B2
(45) Date of Patent: *Jul. 22, 2003

(54) ELECTRICALLY TUNABLE FABRY-PEROT STRUCTURE UTILIZING A DEFORMABLE MULTI-LAYER MIRROR AND METHOD OF MAKING THE SAME

(75) Inventor: Parvis Tayebati, Watertown, MA (US)

(73) Assignee: CoreTek, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/994,572

(22) Filed: Nov. 27, 2001

(65) Prior Publication Data

US 2002/0126725 A1 Sep. 12, 2002

Related U.S. Application Data

(63) Continuation of application No. 09/059,877, filed on Apr. 14, 1998, now Pat. No. 6,324,192, which is a continuation-in-part of application No. 08/726,050, filed on Sep. 27, 1996, now Pat. No. 5,739,945.
(60) Provisional application No. 60/004,619, filed on Sep. 29, 1995.

(51) Int. Cl.$^7$ ............................ G02B 26/00; H01S 3/10; H01S 5/00
(52) U.S. Cl. ...................... 359/291; 372/20; 372/99; 372/43
(58) Field of Search ........................... 359/291; 372/20, 372/99, 43–46

(56) References Cited

U.S. PATENT DOCUMENTS

| | | | |
|---|---|---|---|
| 4,377,324 A | 3/1983 | Durand et al. | |
| 4,713,493 A | 12/1987 | Ovshinsky | |
| 4,825,262 A | 4/1989 | Mallinson | |
| 4,859,060 A | 8/1989 | Katagiri et al. | |

(List continued on next page.)

FOREIGN PATENT DOCUMENTS

WO   WO 98/14807   4/1998

OTHER PUBLICATIONS

Jerman et al., "A Miniature Fabry–Perot Interferometer With A Corrugated Silicon Diaphragm Support", Sensor and Actuators A,29 (1991), pp. 151–158.

Goosen et al., "Silicon Modulator Based On Mechanically–Active Reflection Layer With 1 Mbit/sec Capability For Fiber–In–The–Loop Applications", IEEE Photonics Technology Letters, vol. 6, No. 9, Sep. 1994, pp. 1119–1121.

Larson et al., "Broadly Tunable Resonant–Cavity Light Emission", Appl. Phys. Lett., vol. 67, No. 5, Jul. 31, 1995, pp. 590–592.

*Primary Examiner*—Paul Ip
*Assistant Examiner*—James Menefee
(74) *Attorney, Agent, or Firm*—Pandiscio & Pandiscio

(57) ABSTRACT

An electrically tunable Fabry-Perot structure using a deformable multi-layer mirror construction wherein $Ga_{1-a}Al_aAs$, where a<0.1, is used as the sacrificial layer which may be selectively removed using a citric acid enchant. The multi-layer mirrors consist of N and M period of quarter wavelength layers where N and M are integers, or integers plus ½. Further, the mirrors are made from alternating layers of $Ga_{1-x}Al_xAs$, where x>0.96, and a material selected from the group consisting of either $Ga_{1-z}Al_zAs$, where 0.7>Z>0, or $Ga_{1-y}Al_yAs/Ga_{1-z}Al_zAs/Ga_{1-y}Al_yAs$, where 0.7>Z>0 and y>0.5. The $Ga_{1-x}Al_xAs$ is wet oxidized by exposing its edge to water in a nitrogen or helium atmosphere at a temperature of between about 360° C. and 450° C. so as to transform it to $AlO_x$. The resulting $AlO_x$ layers abut the sacrificial layer and act as etch stops during the formation of a cantilever Fabry-Perot structure by etching of the sacrificial layer.

1 Claim, 11 Drawing Sheets

U.S. PATENT DOCUMENTS

| | | |
|---|---|---|
| 5,022,745 A | 6/1991 | Zayhowski et al. |
| 5,142,414 A | 8/1992 | Koehler |
| 5,212,582 A | 5/1993 | Nelson |
| 5,291,502 A | 3/1994 | Pezeshki et al. |
| 5,331,658 A | 7/1994 | Shieh et al. |
| 5,339,326 A | 8/1994 | Tsujimura et al. |
| 5,491,710 A | 2/1996 | Lo |
| 5,559,358 A | 9/1996 | Burns et al. |
| 5,561,523 A | 10/1996 | Blomberg et al. |
| 5,561,680 A | 10/1996 | Haberern et al. |
| 5,568,499 A | 10/1996 | Lear |
| 5,629,951 A | 5/1997 | Chang-Hasnain et al. |
| 5,646,729 A | 7/1997 | Koskinen et al. |
| 5,739,945 A * | 4/1998 | Tayebati .................... 359/291 |
| 5,757,837 A | 5/1998 | Lim et al. |
| 5,771,253 A | 6/1998 | Chang-Hasnain et al. |
| 5,818,862 A | 10/1998 | Salet |
| 5,825,796 A | 10/1998 | Jewell et al. |
| 5,879,691 A | 3/1999 | Scott et al. |

* cited by examiner

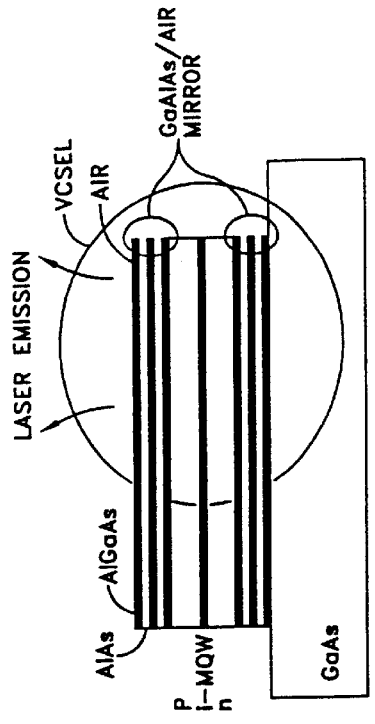
FIG. 1a
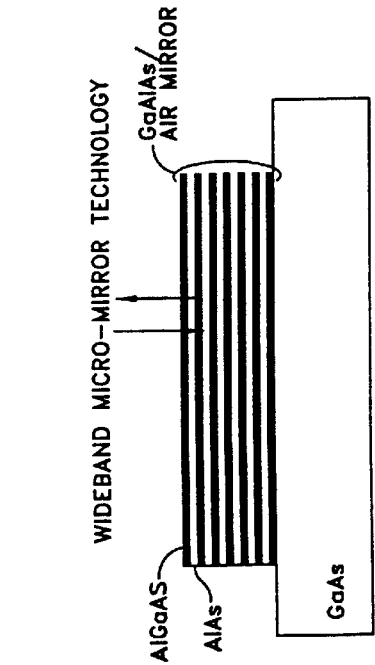
FIG. 1b
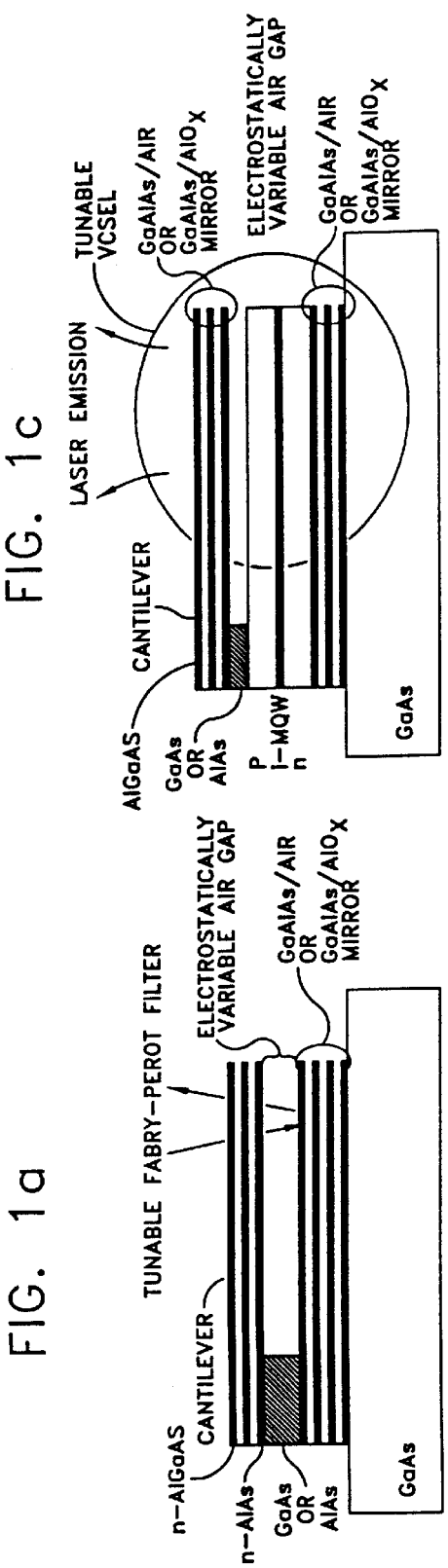
FIG. 1c
FIG. 1d
(a) MY MICROMACHINED GaAlAs GaAlAs/AIR MIRROR CAN BE APPLIED TO FABRICATE
(b) BROADLY TUNABLE FABRY-PEROT FILTERS
(c) HIGH YIELD, LOW THRESHOLD VCSELs AND
(d) BROADLY TUNABLE VCSELs

PROGRESS OF TUNABLE FABRY-PEROT TECHNOLOGIES

*HYBRID MEANS INTEGRATION OF DISCRETE DEVICES OR COMBINATION OF GaAs AND Si TECHNOLOGIES

REFLECTIVITY OF DISTRIBUTED BRAGG REFLECTORS CONSISTING OF DIFFERENT MATERIALS. DUE TO LARGE INDEX VARIATION GaAs/AIR-GAP MIRRORS GIVE THE HIGHEST REFLECTIVITY WITH MINIMUM NUMBER OF LAYERS

THE FREQUENCY SPECTRA OF A TYPICAL FABRY-PEROT STRUCTURE

FABRICATION SEQUENCE FOR THE CANTILEVER-SHAPED TUNABLE FILTERS
(a) THE INITIAL STARTING SUBSTRATE
(b) OPENING OF CRATERS TO BE ABLE TO REMOVE AlGaAs LAYERS FROM THE BOTTOM MIRRORS DURING THE SUBSEQUENT STEPS
(c) DEFINITION OF CANTILEVER STRUCTURES
(d) REMOVAL OF THE SPACING AND LOW INDEX MATERIALS TO FINALIZE THE DEVICE FABRICATION

AN ALTERNATIVE APPROACH TO AIR-GAPS IS THE OXIDATION OF AlAs LAYERS. AlAs CAN BE LATERALLY OXIDIZED. IN MY CASE, THE OXIDATION OF THE SACRIFICIAL LAYER SHOULD BE AVOIDED AS IT WILL LATER BE REMOVED TO ACHIEVE A TUNABLE CAVITY. THEREFORE, THE USE OF A METAL PLUG IS A CRITICAL STEP IN MY FABRICATION SEQUENCE.

A "TRAMPOLINE" PLATFORM CAN BE USED INSTEAD OF A CANTILEVER AS THE MOVABLE TOP MIRROR TO IMPROVE THE FREQUENCY RESPONSE OF THE PROPOSED DEVICE.

THE AMOUNT OF BENDING WITH APPLIED VOLTAGE
(a) FOR A 100 um LONG DEVICE AND,
(b) FOR A 300 um LONG DEVICE

THE SPECTRAL RESPONSE OF THE PROPOSED DEVICE. OMLY 2.5 MIRROR PAIRS WERE USED IN EACH STACK OF THE FABRY-PEROT STUTURE.

ELECTRICALLY TUNABLE FABRY-PEROT STRUCTURE UTILIZING A DEFORMABLE MULTI-LAYER MIRROR AND METHOD OF MAKING THE SAME

REFERENCE TO PENDING PRIOR PATENT APPLICATION

This is a continuation of pending prior U.S. patent application Ser. No. 09/059,877, filed Apr. 14, 1998, now U.S. Pat. No. 6,324,192 by Parviz Tayebati for ELECTRICALLY TUNABLE FABRY-PEROT STRUCTURE UTILIZING A DEFFORMABLE MULTI-LAYER MIRROR AND METHOD OF MAKING THE SAME. This patent application is a continuation-in-part of pending prior U.S. patent application Ser. No. 08/726,050, filed Sep. 27, 1996, now U.S. Pat. No. 5,739,945 by Parviz Tayebati for NOVEL MICROELECTROMECHANICAL GAALAS OPTO-ELECTRONIC DEVICES, which in turn claimed benefit of then-pending prior U.S. Provisional Patent Application Ser. No. 60/004,619, filed Sep. 29, 1995 by Parviz Tayebati for NOVEL MICROELECTROMECHANICAL GAALAS OPTOELECTRONIC DEVICES, both of which documents are hereby incorporated herein by reference.

THE PRESENT INVENTION

I have developed a novel micromachined GaAlAs/air mirror technology for optoelectronic applications.

More particularly, I have developed a series of advanced micro-mechanical optoelectronic devices based on a novel broad-band multilayer GaAlAs/air mirror technology (see FIGS. 1A–1D). My new micro-mirror technology is fabricated by epitaxial growth of GaAs/GaAlAs structures, followed by highly selective lateral etching of the high-aluminum-content GaAlAs layers. Because of the large index difference between the GaAs and air layers (3.5 and 1), the resulting multilayer GaAlAs/air structure is an extremely efficient multilayer mirror, with very broad bandwidth. It can be shown that with only three (3) periods of my mirror structure, reflectivity of over 99.990% can be achieved with 700 nm (nanometer) bandwidth. By comparison, over twenty (20) periods of standard GaAs/AlAs structure are needed to achieve 99.900% reflectivity, at the cost of limited bandwidth of less than 25 nm.

My simple but powerful micromachined structure can be applied to solve a variety of technological problems, and allows the fabrication of new devices where broadband mirrors are required.

A short list of technological breakthroughs resulting from this concept are as follows:

Broadly Tunable Fabry-Perot Filters

A novel tunable Fabry-Perot filter based on my GaAlAs/air mirror is shown in FIG. 1B. The device consists of top and bottom GaAlAs/air mirrors and an AlAs cavity spacing which is etched away to allow formation of a cantilever. Application of an applied field will change the cavity length and shift the transmission peak of the Fabry-Perot filter. The broad (700 nm) bandwidth of the mirror allows a tuning range of over 500 nm. The high reflectivity and high quality of the mirrors will allow better than 1 angstrom linewidth. However, due to the bending of the cantilever, the Fabry-Perot interfaces shown in FIG. 1B will not remain parallel, causing a slight broadening of the linewidth. For many applications—such as switching—this will not be important. For other applications where the narrow linewidth is critical, a "trampoline" structure has been designed and is presented.

The device can further be integrated with laterally grown detectors for a wide range of spectroscopic applications such as environmental monitoring (e.g., toxic gases such as methane or acetylene, with absorption lines at 1330 nm and 1770 nm), or biomedical applications such as the measuring of blood sugar levels requiring spectroscopy near 2100 nm, etc.

Furthermore, the small size, and the compatibility of the devices with multimode fibers, is very attractive for such commercial applications.

Fixed Wavelength VCSEL's

A critical parameter in fabricating vertical cavity surface emitting laser (VCSEL) devices is that the top and bottom mirror reflectance "peaks", and the laser "exciton peak", must correspond. Considering the narrow spectral response (25 nm) of GaAs/AlAs, and the inhomogeneous growth of GaAlAs across a wafer (more than 3% composition variations resulting in over 30 nm variation), makes the growth of such devices low yield and costly. My GaAlAs/air mirror technology shown in FIG. 1C will impact this technology in two ways:

(i) The broad bandwidth of the GaAlAs/air mirrors will relax the restrictive growth conditions since the mirrors are broadband, allowing perfect overlap with the exciton peak throughout a wafer. This will allow fabrication of working VCSEL devices with GaAlAs/air mirrors from any part of the wafer.

(ii) The higher mirror reflectivities will reduce the laser threshold conditions by increasing the Q-factor of the laser cavity.

Tunable VCESL's

The new tunable filter technology shown in FIG. 1B, and the new VCSEL technology shown in FIG. 1C, can be combined to yield a new tunable VCSEL technology as shown in FIG. 1D. In this new tunable VCSEL, the top GaAlAs/air mirror is formed into a cantilever which can be moved up and down electrostatically to tune the lasing wavelength. Again, the high reflectivity and the wide bandwidth of the mirrors will allow the laser to emit continuously and over a wide wavelength range. The tuning range will, of course, be limited to the gain bandwidth of the diode, i.e., approximately 50 nm.

My new tunable filter device consists of a GaAs micromachined tunable filter chip and can be as small as 500 microns by 500 microns, with a response time of several microseconds. The cost of this device is low, since thousands of GaAs chips are mass-manufactured using conventional semiconductor processing techniques. One of the most important features of my new device is its improved spectral resolution and bandwidth, due to my approach for fabrication of very high quality mirrors with minimum complexity. As a result, the resolution and the bandwidth of this device is about an order of magnitude better than other micromachining-based technologies.

COMPETING TECHNOLOGIES

FIG. 2 illustrates the evolution of tunable filters over the last ten years. Current state-of-the-art filters are typically hybrid, making it difficult to fabricate them in large volumes. They generally either rely on the use of piezoelectric drivers with complex feedback systems (Queensgate Instruments, England), or on the use of birefringent materials placed between crossed polarizers (for example, Cambridge Research Instruments, Massachusetts, using liquid crystals).

Piezoelectric tunable filters generally have a resolution of 0.1 nm, with 50 nm tuning range (bandwidth).

Liquid crystal (LC)-based filters can exhibit better resolutions, but at the expense of very low efficiency, e.g., as low as 99.0%.

The fabrication of these hybrid systems is a labor-intensive process, thus increasing the cost of these devices. For example, the top-of-the-line model sold by Queensgate Instruments costs above $10,000. Such high costs make them unrealistic for most applications. Specifically, in upcoming communications networks, it is anticipated that all of the information delivered to each household (500 channel TV, telephone, etc.) will be transmitted over a fiber optic line using wavelength division multiplexing. This will necessitate the use of a tunable filter in every home. In order for such a system to be feasible, the cost of a tunable filter should be in the tens-of-dollars range, at the most.

In attempting to adopt micromachined technologies for fabrication of low cost tunable filters[1,2,3], a number of approaches have been initiated.

Larson and et al. built a GaAs-based interferometer[1]. They used a GaAs/AlAs stack as the bottom mirror and a gold-coated silicon nitride membrane as the top mirror.

Jerman and et al.[2] bonded two different wafers to build their micromachined membranes. They used dielectric mirrors with 97.5% refractivity at 1.55 mm$^2$.

In the work of Reference 3, a silicon nitride membrane is suspended over a silicon substrate. The device is used as a light modulator based on the interference effect between the substrate and the suspended membrane.

All prior micromachined filter technology tends to suffer from the limited reflectivity and bandwidth of the cavity mirrors.

The bandwidth $\Delta\lambda$ of a periodic layered structure (with indices $n_1$ and $n_2$) is given by the well know formula[4]:

$$\Delta\lambda/\lambda = (4/\pi)\sin^{-1}((n_2-n_1)/(n_2+n_1))$$

This shows a direct link between the index difference between layers and the bandwidth.

Similarly, the peak reflectivity is a function of the number of layers in the dielectric stack and the index difference between the layers.

When used in a tunable Fabry-Perot device (e.g., filter or VCSEL), both the reflectivity and the bandwidth of the mirrors play key roles: the reflectivity determines the spectral resolutions of the Fabry-Perot device and the bandwidth limits the tunability range. Therefore, it is desirable to have as large of an index difference as possible in order to achieve highly reflective and broadband mirrors.

As mentioned above, a conventional mirror stack consists of GaAs/AlAs layers with closely matched indexes of refraction (3.5 vs. 3.0). It is therefore difficult to make high quality Fabry-Perot structures using these layers.

I substitute the low index AlAs material with the following:

(i) Air Gaps: By selectively etching AlAs (or high aluminum content GaAlAs) layers (using HF or HCl based solutions) from the original GaAs/AlAs stack, one can achieve a mirror stack consisting of GaAs/air gaps. As air has an index of refraction of 1, this results in the highest possible index difference using GaAs technology. The selective etching region can also be GaAs, in which case it can be removed by conventional citric acid solutions.

(ii) Oxidized AlAs: AlAs (or high aluminum content GaAlAs) layers in epitaxially grown GaAlAs materials can be oxidized laterally using conventional wet oxidation techniques. Oxidized AlAs has an index of refraction of 1.5, as opposed to 3.0 of non-oxidized AlAs. This is a significant index difference, and mirrors made of oxidized AlAs/GaAs stacks approach the quality of GaAs/air gap stacks in terms of bandwidth and reflectivity.

FIG. 3 illustrates the number of layers in a dielectric stack required to achieve a reflectivity approaching 100%. In the case of GaAs/AlAs, 15 layers are needed to obtain 99% reflectivity, whereas with GaAs/air mirrors, only 4 layers are needed to achieve 99.999% reflectivity.

Although oxidized AlAs/GaAs based mirrors are inferior to GaAs/air gap mirrors, they may have a higher fabrication yield due to the inherent mechanical stability. However, as shown below, their fabrication as a whole does require more photolithographic steps.

The use of these low index air gap or oxidized AlAs layers increases the bandwidth of my devices by an order of magnitude compared to other known devices. Similarly, my devices can achieve a resolution in the 0.1–0.3 nm range. This is comparable to the best filters available with the expensive hybrid technology, and one order of magnitude better than with other micromachining-based approaches.

BRIEF DESCRIPTION OF THE DRAWINGS

FIGS. 1A–1D are representations of broad band multi-layer mirror technology;

DETAILED DISCUSSION

A key to fabrication of the "high aspect" ratio features in the GaAlAs/air mirror structure shown in FIG. 1A is the high selective etching of $Ga_{(1-x)}Al_xAs$ materials as a function of the composition factor x. $HF:H_2O$ etches $Ga_{(1-x)}Al_xAs$ materials with x>0.45 at a rate of over $10^7$ times faster than those with x<0.45. This technology has been the basis of the so-called "epitaxial liftoff" technology whereby a layer of AlAs grown underneath a GaAlAs device (e.g., lasers and detectors) can be etched laterally to allow the liftoff of the entire structure for follow-up deposition on other substrates such as glass or silicon. Up to 2 cm (centimeter) films have been lifted from the GaAs substrate using this technique, indicating the extreme selectivity of the etching technique. I have designed a complete procedure which allows using this property for fabrication of reliable GaAlAs/air micromirrors.

Why GaAs Micromachining?

I chose the micromachining of GaAs over Si for several important reasons:

(i) Use of GaAs technology for the proposed tunable filters opens up the possibility of integration with other optoelectronic devices such as laser diodes and detectors which are not possible with silicon-based micromachining.

(ii) GaAs/AlAs crystal growth technologies such as Molecular Beam Epitaxy (MBE) and Metal Oxide Chemical Vapor Deposition (MOCVD) make it possible to grow layers accurately down to a single monolayer. This is a key requirement for high quality Fabry-Perot cavities where small thickness variations can cause large fluctuations in the frequency response.

(iii) GaAs/AlGaAs based filters cover a broader wavelength range than silicon based filters (0.65–1.6 mm vs. 1.1–1.6 mm), rendering them more versatile devices for many applications.

(iv) The availability of highly selective etching solutions (up to $10^7$:1 using $HF:H_2O$) in III–V systems makes it possible to easily fabricate high aspect ratio devices such as the present devices. This is a key technology factor in the present invention.

(v) Recent studies show that GaAs cantilevers can withstand forces which approach 10 G's.[6] This means that the present devices can be rugged and suitable for field applications.

Background

In its simplest form, a Fabry-Perot structure consists of two parallel, flat, transparent surfaces coated with high reflectivity layers. The spacing between the surfaces forms the resonant cavity. When light is incident on such a structure, it is subject to multiple reflections between the two coated surfaces. At the resonant wavelengths, these reflected beams interfere destructively and all of the incident light is transmitted through the structure.

Figure 2:
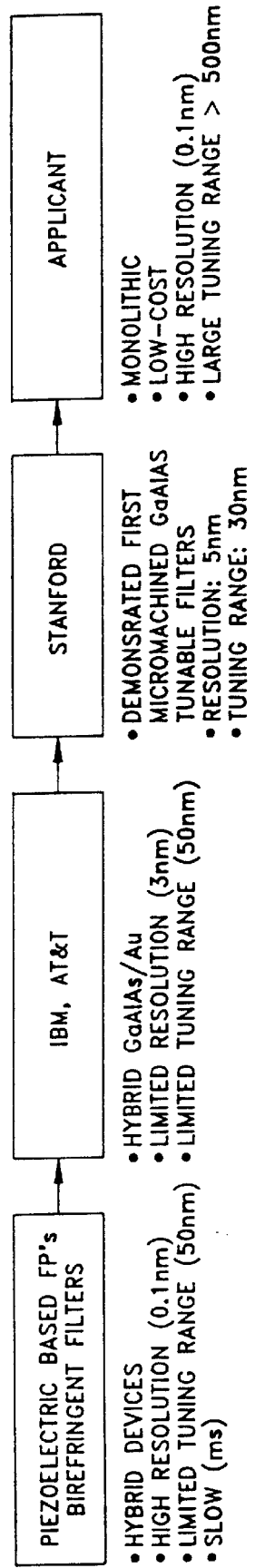
FIG. 2 is a diagram of the evolution of tunable filters over the last ten years.
Figure 3:
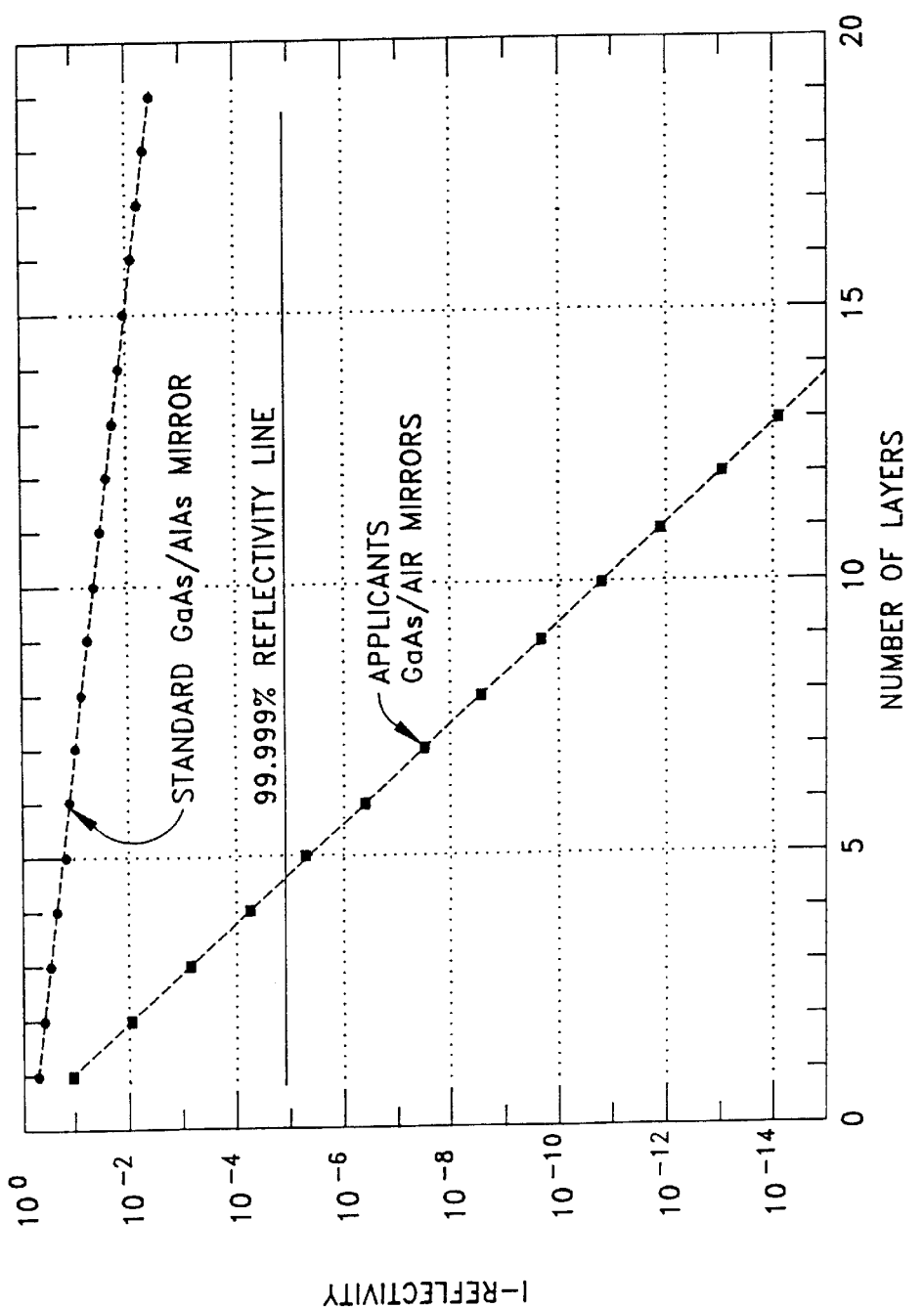
FIG. 3 is a reflectivity diagram of a multi-layer stack reflector.
Figure 4:
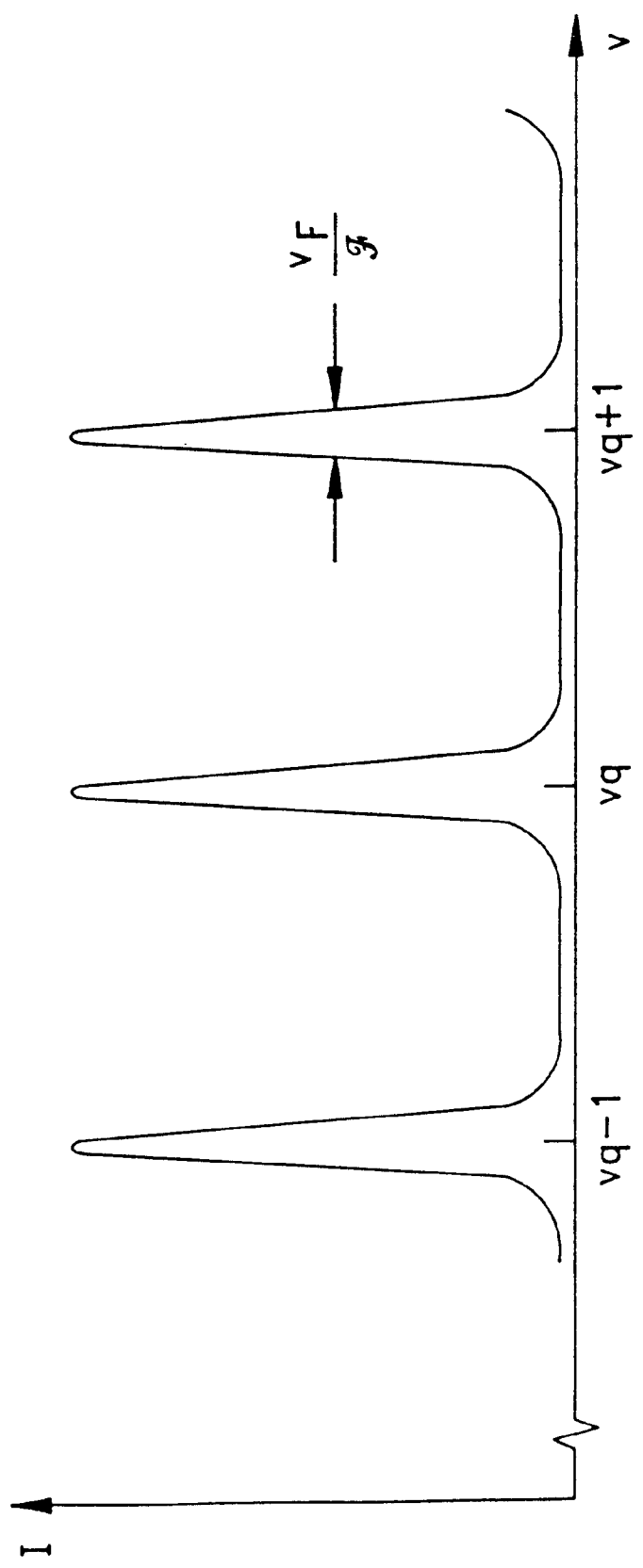
FIG. 4 is a diagram of the frequency spectrum of a typical Fabry-Perot structure.

The resonant frequencies of the Fabry-Perot structure are given by the equation:

$$m\lambda = 2nt$$

where m is an integer known as the order of interference, l is the wavelength, n is the index of refraction and t is the thickness of the structure. The spectral response of such a structure consists of a comb-like series of bandpass peaks (see FIG. 4). The width of each resonant peak determines the resolution of the device. The full width of the peaks at the half-maximum value is given by the equation[4]:

$$\Delta v_{(\frac{1}{2})} = (c/2l)((1-R)(\pi\sqrt{R}))$$

where c is the speed of light, l is the cavity length and R is the reflectivity of the mirrors.

A very high reflectivity is desired to achieve high resolutions. The general equation for the transmission $\tau_A$ of a Fabry-Perot device is given by the equation[7]:

$$\tau_A = (T^2/((1-R)^2))[1+(((4R)/(1-R)^2)\sin^2)(2\pi nl \cos \theta/\lambda)]$$

where R and T are the reflection and transmission coefficients, and $\theta$ is the angle of incidence within the cavity. A examination of this equation shows that one can change the transmission wavelength by changing the index of refraction in the cavity, by tilting the structure with respect to the incident beam, or by mechanically changing the spacing between the two surfaces. This last approach previously proved itself to be most viable due to the availability of high quality piezoelectric transducers. However, the accuracy with which the plates must be moved is still very demanding and requires complicated mechanisms to actively control the plate spacing.

A more simple approach can be introduced by using tunable birefringent filters such as Lyot, partial polarizing and Solc filters.[8,9,10] These techniques rely on the coupling of light from the fast to slow axis of birefringent crystals placed between crossed polarizers. These techniques require the use of at least one polarizer and an analyzer, therefore reducing the efficiency of the system by at least 50%. These devices are also far from being compact. In some cases, they consist of multiple stages of analyzer/polarizers with birefringent crystals.

Device Fabrication

There are two important factors effecting the quality of a Fabry-Perot structure: the thickness of the Fabry-Perot cavity which determines the resonant wavelengths, and the properties of the mirrors which determine the resolution and the bandwidth of the Fabry-Perot structure.

GaAs/Air Gap Mirror Based Fabry-Perot Structure

Figure 5A:
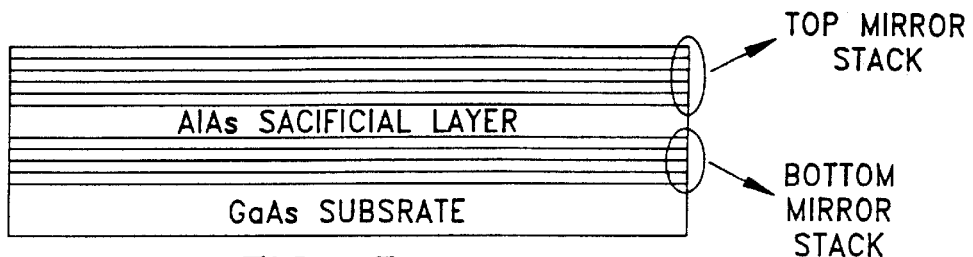
FIGS. 5A–5D are illustrations of the steps to produce a cantilever-shaped tunable filter.
Figure 5B:
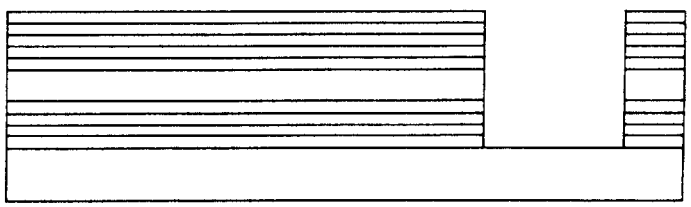
Figure 5C:
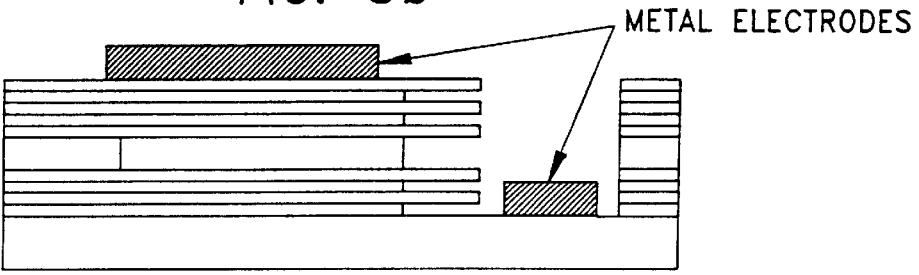

FIG. 5A shows the cross-section of my starting substrate. My structure consist of two mirror stacks separated by a sacrificial layer, GaAlAs. The layers for the proposed structure can be grown with great accuracy using MBE or MOVCD techniques. By selectively removing the sacrificial layer, the top mirror can be machined into a cantilever or a platform. In this case, the cantilever or the platform contains the top distributed Bragg reflector (DBR), whereas the substrate contains the bottom DBR of the Fabry-Perot structure. The two mirrors are now separated by an air gap, and this gap can be changed by applying an electric field to the top and bottom electrodes of the device which makes it possible to tune the resonant frequencies of the device.

The removal of the sacrificial layer is due to the fact that AlAs (or AlGaAs) etches at a much faster rate than GaAs when it is exposed to hydrofluoric based solutions. The selectivity can be as high as 1000:1. As the sacrificial layer and the low index material of the mirror stack are made of the same material (AlAs or AlGaAs), they can be selectively removed during the same fabrication step. The removal of the AlAs layer from the initial mirror stack results in a new mirror stack which consists of alternating air gap/GaAs layers. The index difference for air/GaAs stacks is 3.5, and very large reflectivity can be achieved with very few stacks of air/GaAs pairs.

The sequence of the fabrication process for cantilever-shaped top mirrors is illustrated in FIGS. 5A–5D.

Figure 5D:
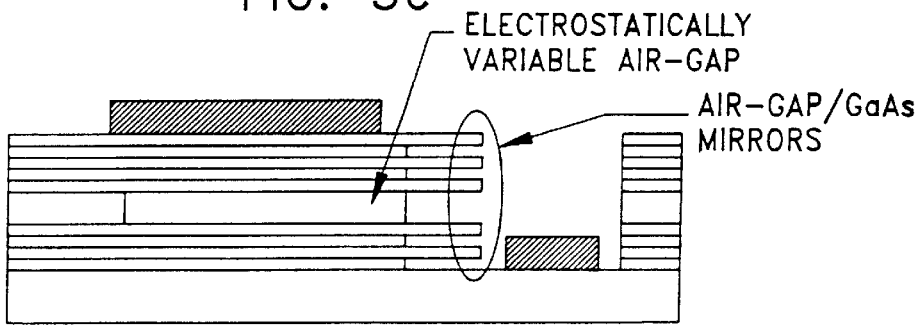

The starting substrate is a GaAs structure with two epitaxially grown DBR's separated by an AlAs sacrificial layer. The sample is then subject to the following fabrication steps:

1. Lithography: Definition of "craters" on the substrate.
2. Etching: Using photoresist as the masking layer, the sample is etched until the sidewalls of the bottom DBR is exposed. The exposure of sidewalls will make it possible to selectively remove the AlGaAs layers of the bottom DBR mirror during the subsequent steps to replace them with air gaps. The etch stop point is not critical and deep craters can be etched to ensure the exposure of the sidewalls (FIG. 5B).
3. Lithography: Definition of cantilever structures.
4. Etching: Using the photoresist mask of the second photolithography step, the top DBR mirror is removed. In this case, it is very critical to stop at the sacrificial layer. This is accomplished by using different selective etching solutions for each layer of the top DBR mirror until the sacrificial layer has been exposed. For example, HF and $NH_4OH$ based solutions can be used to remove AlAs and GaAlAs layers respectively.
5. Lithography: To define the metal electrodes which are required to electrostatically deflect the metal cantilever structures.
6. Metallization: Deposition of metal electrodes (FIG. 5C).
7. Lithography: Definition of "protection" layer for subsequent etching process. The protection layer is required to selectively remove AlAs layers from the DBR mirrors at the tip of the cantilever structures.
8. Etching: The removal of the sacrificial AlAs layer and other AlAs layers of the top and bottom DBR mirrors using HCl or HF solutions. This step completes the fabrication of cantilevers. These cantilevers consist of GaAs/AlAs layers except for at the tip of the cantilever structure, where we have GaAs/air gap layers instead (FIG. 5D). The sacrificial layer can also be GaAs, in which case citric acid solutions are used to remove the sacrificial layer.

GaAs/Oxidized AlAs Based Fabry-Perot Structures

The use of oxidized AlAs layers can provide more mechanical strength and higher fabrication yields.

The fabrication sequence is very similar to the one described in the preceding section. The only difference is that the AlAs layers in the top and bottom DBR mirrors are subject to an oxidation process before the sacrificial layer is removed.

Figure 6:
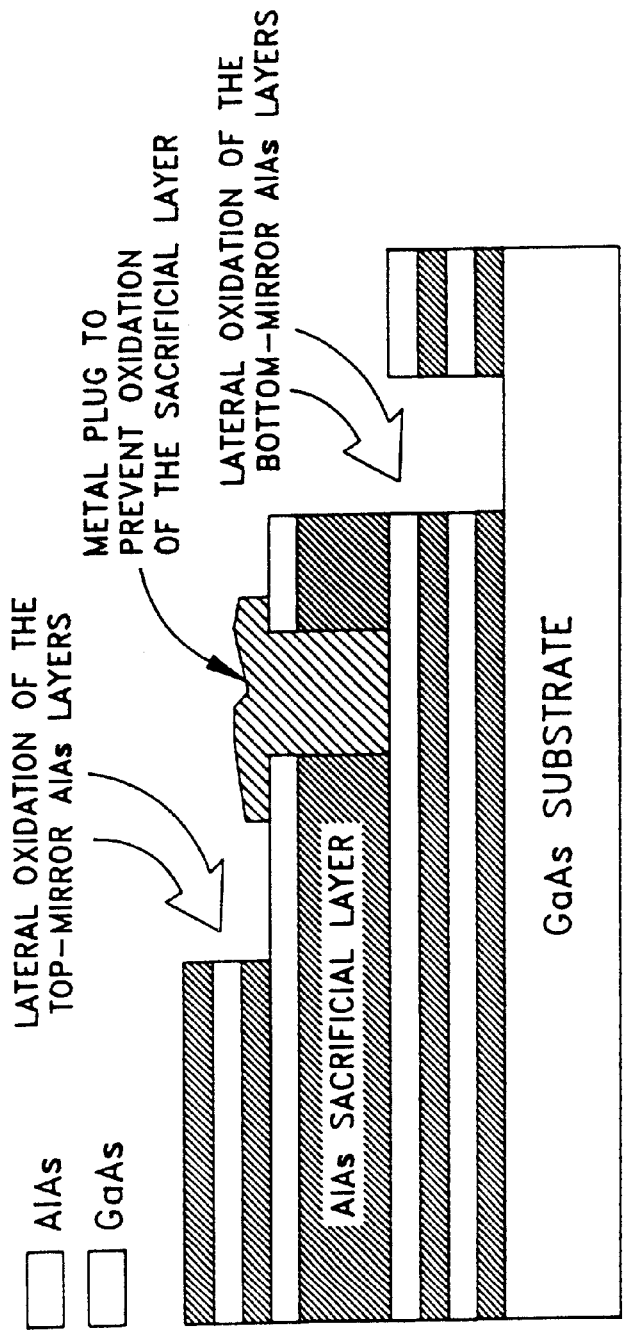
FIG. 6 shows the cross-section of a multi-layer device before oxidation.

FIG. 6 shows the cross-section of the device before the oxidation. The most critical issue here is to prevent the sacrificial AlAs layer from being oxidized as it will be later removed to achieve the tunable cavity. This can be achieved by encapsulating the sacrificial AlAs layer with protective layers from every side during the oxidation process. As shown in FIG. 6, the GaAs layer on the top of the AlAs sacrificial layer prevents it from being oxidized in the vertical direction. A second trench opened around this sacrificial layer and filled with metal will stop its oxidation in the vertical layer. The opening of the second trench and its filling with metal can be done with one lithography mask and does not introduce major complications. The oxidized AlAs has also a low etch rate against the AlAs etching solution and they do not get removed during the sacrificial layer etch.

"Trampoline" Platforms vs. Cantilevers As Mirrors

Figure 7:
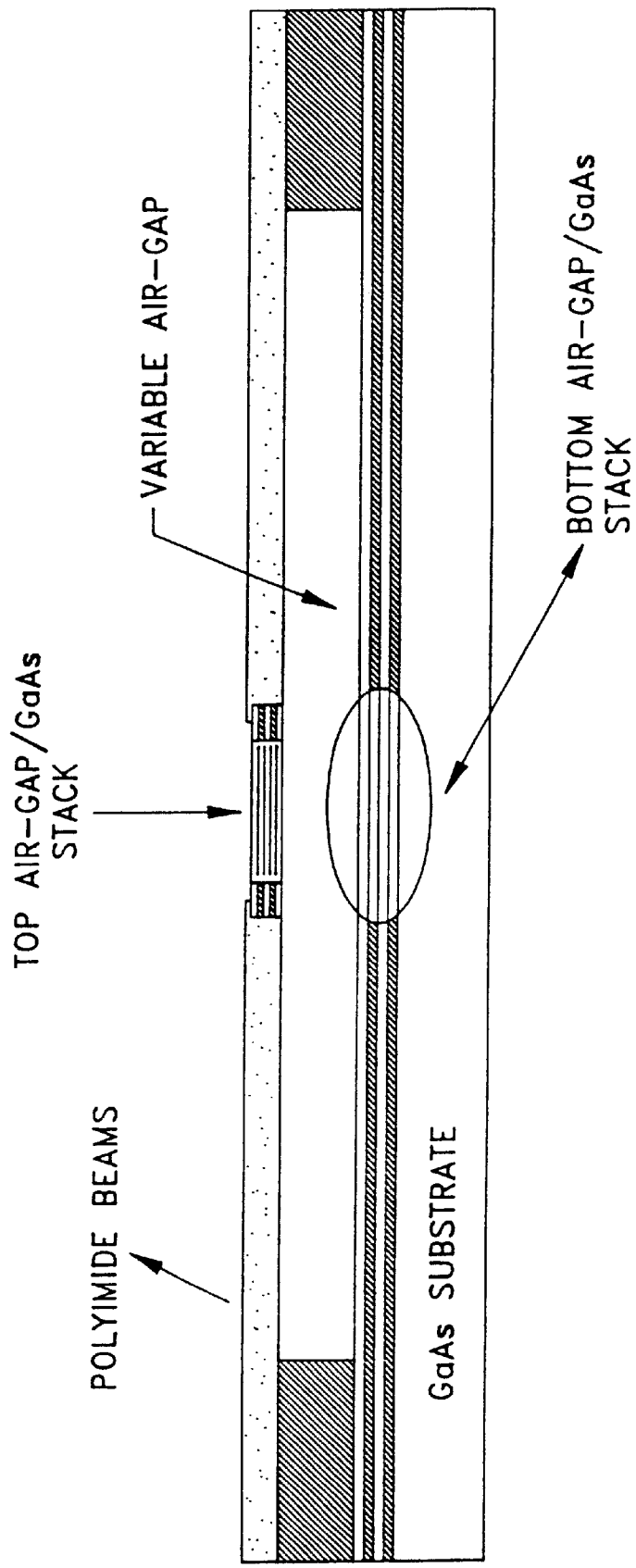
FIG. 7 is a representation of a "trampoline" platform embodiment of the present invention.

Using a cantilever mirror in a Fabry-Perot cavity will result in departures from parallelism between the top and bottom mirrors, which will broaden the interferometer passband. To solve this problem, the top mirror can be fabricated in the shape of a platform resting on two polyimide beams (FIG. 7). When the platform is attracted towards the substrate through electrostatic forces, the polyimide beams will elastically deform, lowering the platform parallel to the substrate. The optimum polyimide material will provide good adhesion to the top mirror, durability in the selective etching solution, and a good enough elasticity to allow lowering and raising of the top mirror.

Additional Construction

Figure 7A:
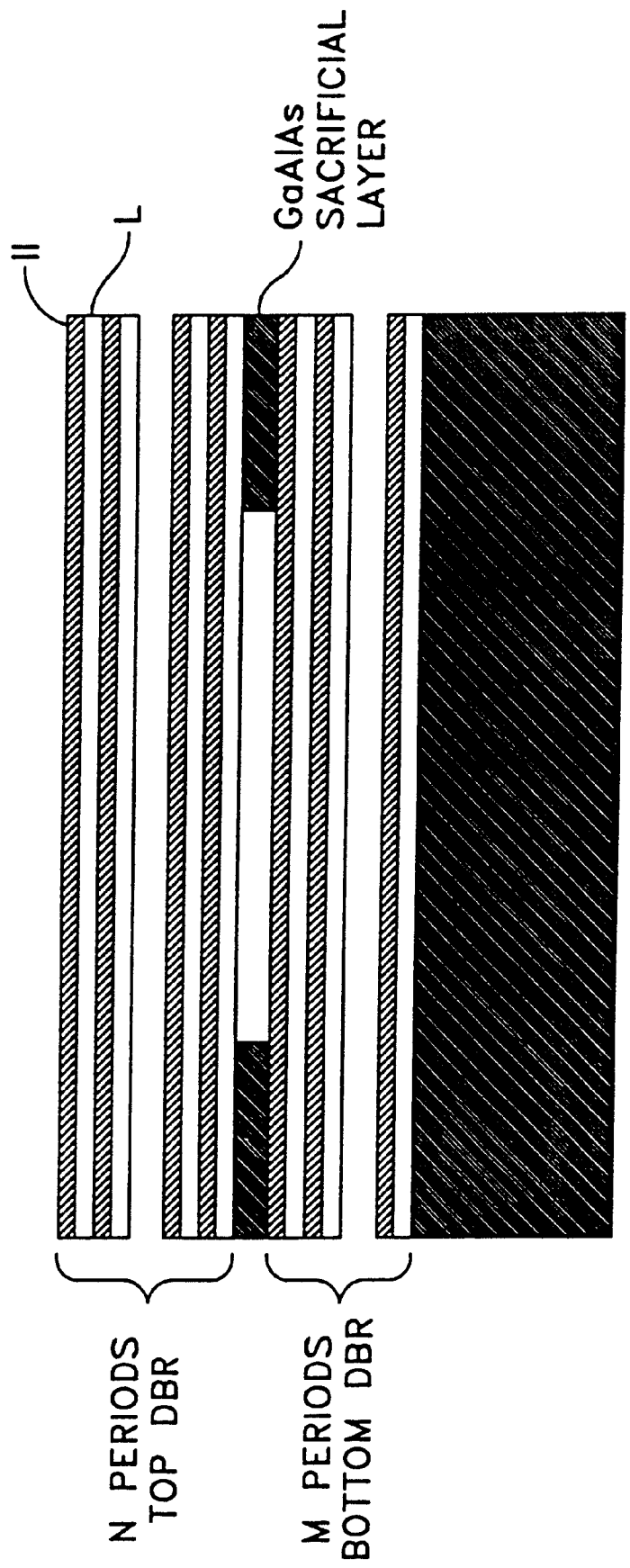
FIG. 7A shows the cross-section of another multi-layer device before oxidation.
Figure 7B:
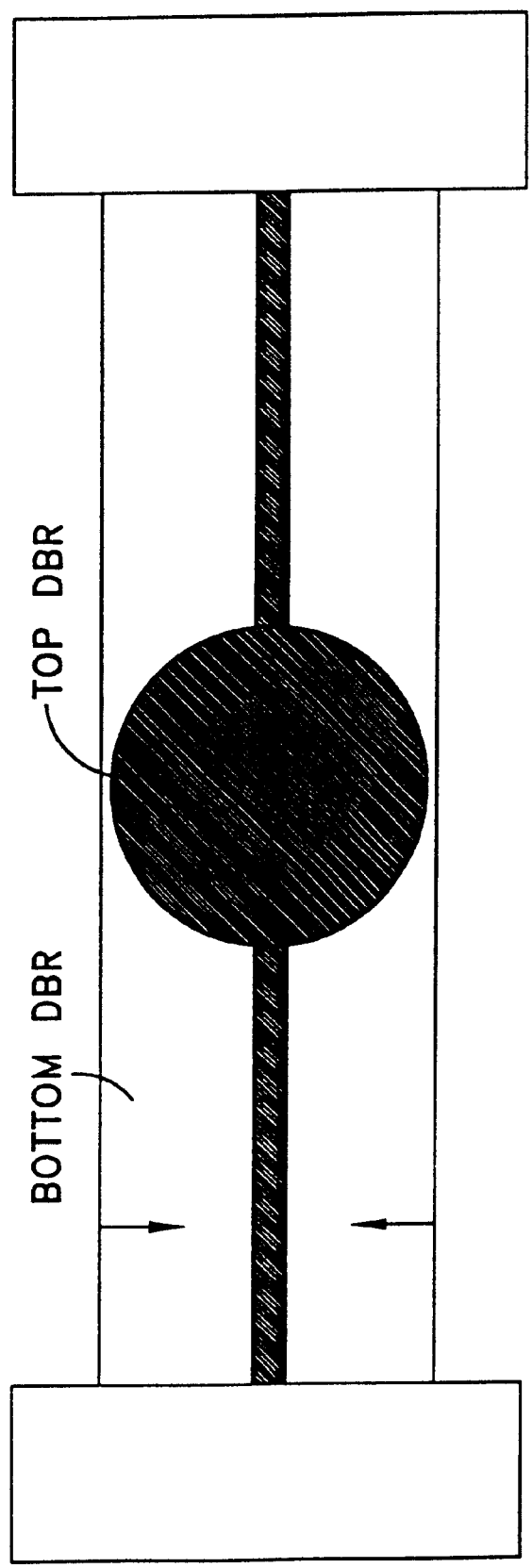
FIG. 7B is a top view of the device of FIG. 7A wherein the direction of oxidation is shown by arrows and the oxidized and undercut areas are shown in gray.

FIG. 7A shows the cross-section of a similar device prior to oxidation, and FIG. 7B shows the directions of oxidation by arrows and the oxidized and undercut regions in gray. In this embodiment of the invention, the reference character L designates quarter-wavelength thick $Ga_{1-x}Al_xAs$ where x>0.96. This material will transform, during a wet oxidation process, to what is commonly referred to in the industry as $AlO_x$, so as to create a low index (n=1.5) layer. By a "wet oxidation" process, I mean exposing the edge of the $Ga_{1-x}Al_xAs$ layers to water in a nitrogen or helium atmosphere at a temperature between about 360° C. and about 450° C.

In this case, the alternate layers of the DBR, designated by the reference character H, are a quarter-wavelength thick, high index layer, or a combination of layers with an effective thickness of one quarter-wavelength. By way of example but not limitation, these layers may be composed of either (i) $Ga_{1-z}Al_zAs$, with Z typically being, but not limited to, 0.7>Z>0, or (ii) $Ga_{1-y}Al_yAs/Ga_{1-z}Al_zAs/Ga_{1-y}Al_yAs$, with y typically being greater than 0.5. In the latter case, the addition of the $Ga_{1-y}Al_yAs$ to the H layers is for the purpose of buffering the stress induced in the $AlO_x$ layer during the high temperature oxidation process.

The sacrificial layer is contemplated to be $Ga_{1-a}Al_aAs$ where a<0.1. This material may be selectively removed using a citric acid enchant.

During the wet oxidation period, the $Ga_{1-x}Al_xAs$ layer is oxidized, but the $Ga_{1-z}Al_zAs$ layers are not oxidized. Further, the layers adjacent to the sacrificial $Ga_{1-a}Al_aAs$ layer will be $AlO_x$ with an extremely high selectivity. The top and bottom DBR's consist of N and M period of quarter-wavelength layers, respectively, where N and M are either an integer, or an integer plus ½, as determined by the narrowest possible Fabry-Perot linewidth and transmittance.

In this example, the layers of the top and bottom DBR's have very broad bandwidths of up to 700 nm and reflectivities of up to 99.9999% using only four or five periods. The theoretical result is Fabry-Perot linewidths of less than 0.1 nm. To date devices have been built by this process which achieve a 0.5 nm linewidth with only four or five periods.

Important Fabrication Steps

The following steps are important:

(i) The precise growth of dielectric mirrors: The fabrication of high quality Fabry-Perot structures requires the precise growth capability of each layer. Fortunately, due to the advances in MBE and MOCVD, these layers can be grown within several atomic layers.

(ii) The availability of highly selective etching solutions: The mirror quality can be improved if the low index material is replaced by an air gap. This necessitates the use of a highly selective etching solution which would etch the low index material but would not attack the high index material. Hydrofluoric acid based solutions do have a selective etch ratio of 1000:1 for GaAs/AlAs systems and provide the ideal solution for the task.

(iii) Undercutting of cantilever structures: The most important step is the fabrication of GaAs/air gap mirrors. It is important that GaAs layers do not bend and stick to each other. GaAs has enough mechanical strength and will not bend under gravitational forces for the proposed physical dimensions[6]. However, during the fabrication, when AlGaAs layers are selectively removed, water trapped between the GaAs layers can force them towards each other due its surface tension. As a result of this bending, two GaAs surfaces can come in contact and permanently stick to each other due to strong surface forces.

Some recent publications show encouraging results as to how to eliminate this problem.

Namatsu et al. have recently fabricated silicon micro-walls which are 24 nm wide and 8000 nm long. They found out that these silicon micro-walls stick to each other when the distance between the two lines is less than 160 nm. They showed that it is possible to calculate the amount of bending force and place the micro-walls far from each other to prevent their collapsing.

Although the GaAs layers are placed much further from each other in my constructions, I have chosen a safer approach to fabricate them.

Takeshima et al. has developed a t-butyl alcohol freeze-drying method to prevent microstructures from sticking to each other. t-butyl alcohol freezes at room temperature. Their technique is based on transferring the sample from the etching solution to a t-butyl alcohol solution which is kept above the room temperature and therefore in liquid form. When the t-butyl alcohol cools back to the room temperature, solution between the air gaps freezes to the solid state. Next, the sample is evacuated and the frozen liquid solution is sublimated in the vacuum. Using this technique, it is possible to dry samples without introducing surface tension forces. The technique is very simple to use and it only requires a hot plate, a mechanical pump and a vacuum jar.

(iv) Use Of "Trampoline" Platform As Top Mirrors: Fabrication of platform-shaped top mirrors is not as straightforward as cantilevers, and it requires the use of a polyimide layer with optimum properties.

Modeling of the Structures

It is possible to vary the cavity length as much as 100% with very small voltages. Assuming a parallel plate capacitor, the force between the cantilever and the substrate is given by[1]:

$$F_{electrostatic} = \epsilon_0 A(V^2/2d^2)$$

where $\epsilon$ is the permittivity in vacuum, A is the area of the cantilever, V is the applied voltage and d is the spacing between the top and bottom mirrors.

For a cantilever, the amount of bending can be given by[5]:

$$F_{bend} = (3EI/l^3)x$$

where $F_{bend}$ is the force applied to the tip of the cantilever, E is the Young's modules, I is inertia, l is the length of the cantilever and x is the amount of bending.

The beam will break if the applied force exceeds a certain value[5]:

$$F_{break} = (wt^2/6l)(\sigma_F/n)$$

where w is the width, l is the length, t is the thickness of the beam and $\sigma_F$ is the fracture stress.

Figure 8A:
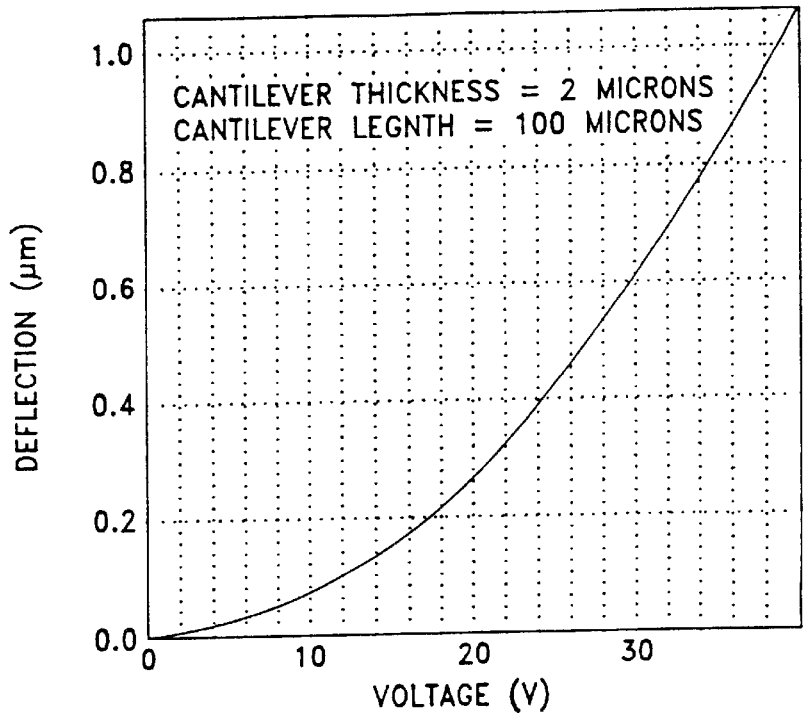
FIGS. 8A and 8B are graphs describing the amount of bending of the reflective device under an applied field.
Figure 8B:
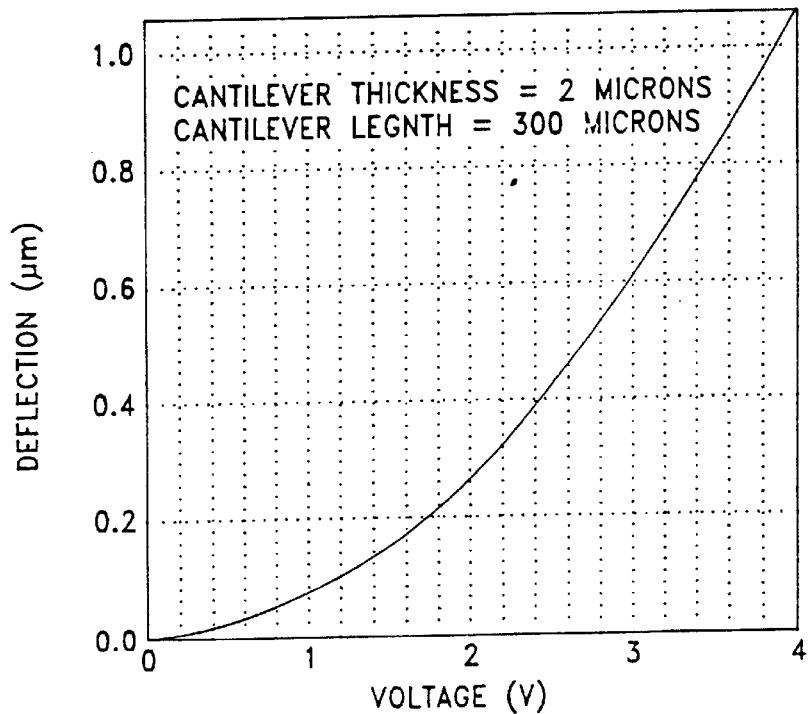

Based on the above equations, it is possible to compute the amount of bending under the applied field (FIGS. 8A and 8B). As it can be seen from FIG. 8A, a 100 micron long cantilever can be moved by a micron with only 10 V applied across it. The voltage drops even further when the cantilever length is increased to 300 microns. It can also be shown from the above equations that the bending is independent of the cantilever width.

Figure 9:
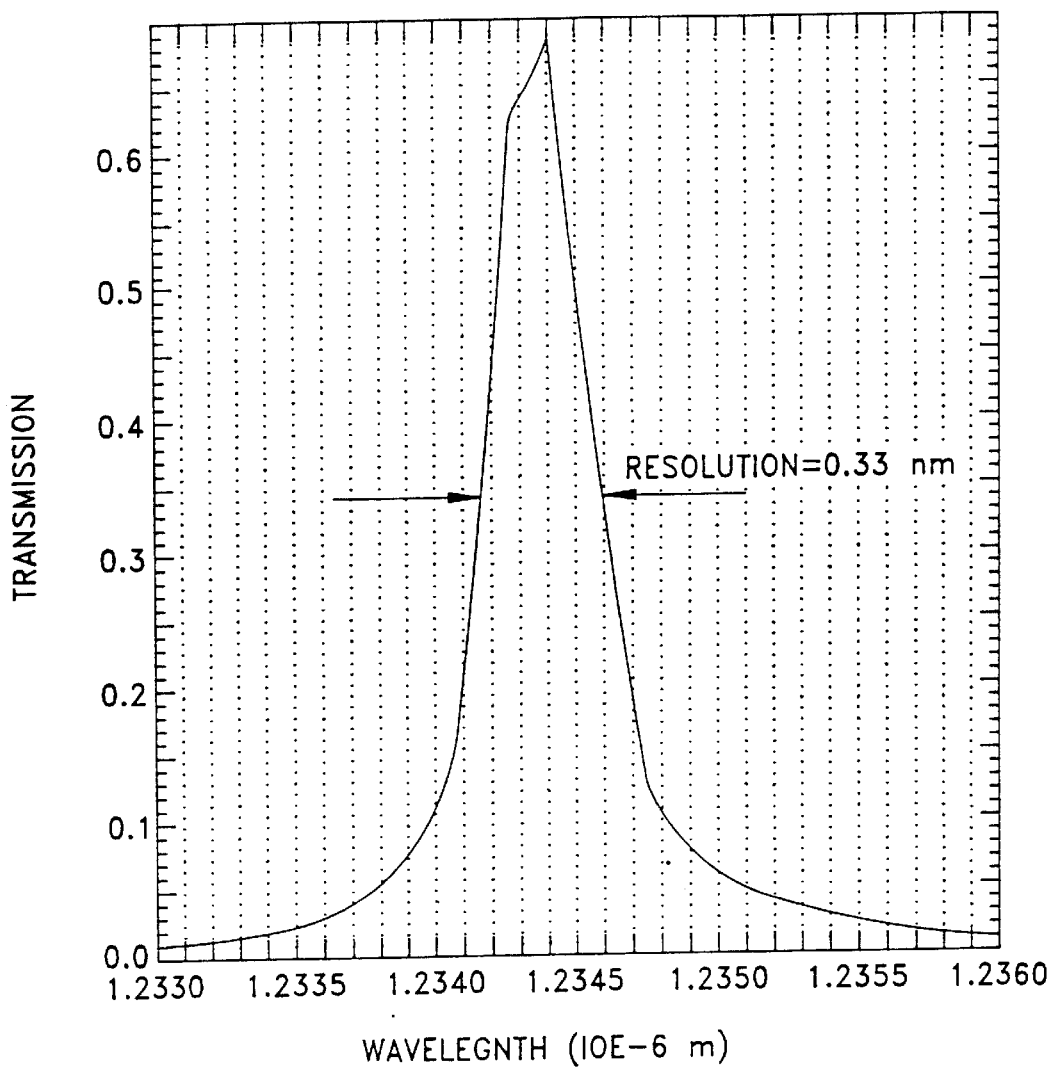
FIG. 9 is a graph of the spectral response of the present invention.

I have also developed a model for multilayer films to compute the transmission and the reflectivity through such structures. FIG. 9 shows the spectral response for the proposed structure. For a 2.5 pairs of GaAs/air gap pairs in each mirror, a resolution of 0.3 nm can be achieved. Here the GaAs and air gap layers are 0.01 micron and 0.0325 micron, respectively. This device has a bandwidth of 750 nm and its resonant cavity can be tuned from 1 micron to 1.75 mm by changing the separation between the two mirrors.

Other Applications

This invention targets a multi-billion dollar fiber-optic telecommunications industry. Future fiber lines will largely utilize wavelength division multiplexing, and a low-cost, high quality tunable filter will find usage in every household. However, there are many other areas where the present apparatus or fabrication techniques will find immediate usage. One such field is optical spectrometry. A PC-compatible, rugged spectrometer is crucial in many engineering applications. Other important areas are tunable surface emitting lasers, and resonant cavity diodes. The fabricated devices can also be used as optical switches and as spatial light modulators. These devices will also have application in many other areas including optical computing, optical neural nets, robotics, etc.

References

[1] M. C. Larson, B. Pezeshki, J. S. Harris, "Vertical Coupled-Cavity Microinterferometer on GaAs with Deformable-Membrane Top Mirror", IEEE Photonics Technology Letters, Vol. 7, No. 4, April 1995, p. 382.

[2] J. H. Jerman, D. J. Clift, S. R. Mallinson, "A miniature Fabry-Perot interferometer with a corrugated diaphram support", Sensors and Actuators A, 29 (1991) 151–158.

[3] K. W. Goossen, J. A. Walker, S. C. Arney, "Silicon Modulator Based on Mechanically-Active Anti-Reflection Layer with 1 Mbit/sec Capability for Fiber-in-the-Loop Applications", IEEE Photonics Letters, Vol. 6, No. 9, September 1994, p. 1119.

[4] Pochi Yeh, "Optical Waves in Crystals", A Wiley Interscience Publication, John Wiley & Sons.

[5] E. Yablanovich et al. Applied Physics Letters, 1991.

[6] Y. Uenishi, H. Tanaka, H, Ukita, "Characterization of AlGaAs Microstructure Fabricated by AlGaAs/GaAs Micromachining", IEEE Transactions on Electron Devices, Vol. 41, No. 10, October 1994, p. 1778.

[7] P. D. Atherton, N. K. Reay, J. Ring, "Tunable Fabry Perot Filters", Optical Engineering, Vol. 20 No. 6, November/December 1981, p. 806.

[8] A. M. Title, W. Rosenberg, "Tunable birefringent filters", Optical Engineering, November/December 1981, Vol. 20, No. 6, p. 815.

[9] J. F. Lotspeich, R. R. Stephens, D. M. Henderson, "Electro-optic tunable filter", Optical Engineering, Vol. 20, no. 6, November/December 1981, p. 830.

[10] W. J. Gunning, "Electro-optically tuned spectral filters: a review", Optical Engineering, November/December 1981/Vol. 20 No. 6, p. 837.

What is claimed is:

1. An electrically tunable optical filter comprising:

a laterally-extending base comprising an optically-transparent GaAs material;

a first laterally-extending mirror comprising alternating layers of (i) a material selected from the group consisting of GaAs; GaAlAs; and $Ga_{1-y}Al_yAs/Ga_{1-z}Al_zAs/Ga_{1-y}Al_yAs$ where y>0.5 and Z<0.7, and (ii) $AlO_x$;

a second laterally-extending mirror comprising alternating layers of (i) a material selected from the group consisting of GaAs; GaAlAs; and $Ga_{1-y}Al_yAs/Ga_{1-z}Al_zAs/Ga_{1-y}Al_yAs$ where y>0.5 and Z<0.7, and (ii) $AlO_x$;

said first laterally-extending mirror being fixedly mounted to said laterally extending base;

said second laterally-extending mirror being movably mounted to said first laterally-extending mirror such that an air gap extends between said first laterally-extending mirror and said second laterally-extending mirror;

a first electrode electrically connected to said first laterally-extending mirror; and a second electrode electrically connected to said second laterally-extending mirror;

whereby when a voltage difference is applied across said first and second electrodes, the electrically tunable optical filter will change its spectral response.

* * * * *